(12) United States Patent
Yagishita

(10) Patent No.: US 7,247,913 B2
(45) Date of Patent: Jul. 24, 2007

(54) SEMICONDUCTOR DEVICE HAVING A SCHOTTKY SOURCE/DRAIN TRANSISTOR

(75) Inventor: Atsushi Yagishita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 145 days.

(21) Appl. No.: 11/116,328

(22) Filed: Apr. 28, 2005

(65) Prior Publication Data

US 2006/0011986 A1  Jan. 19, 2006

(30) Foreign Application Priority Data

Jul. 13, 2004  (JP)  ............... 2004-205849
Apr. 11, 2005  (JP)  ............... 2005-113482

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .............. 257/368; 257/382; 257/473
(58) Field of Classification Search ............. 257/267, 257/280, 282, 368, 382, 473
See application file for complete search history.

(56) References Cited

U.S. PATENT DOCUMENTS 6,054,355 A  4/2000  Inumiya et al.
6,204,539 B1 *  3/2001  Oyamatsu .............. 257/382
6,346,438 B1  2/2002  Yagishita et al.
6,515,338 B1  2/2003  Inumiya et al.
6,664,592 B2  12/2003  Inumiya et al.
6,887,747 B2  5/2005  Yagishita et al.

OTHER PUBLICATIONS

Kedzierski, et al., " Complementary silicide source/drain thin-body MOSFETs for the 20nm gate length regime", IEDM Technical Digest, pp. 57-60, (2000).
Connelly, et al., "A New Route to Zero-Barrier Schottky Source/ Drain CMOS", Silicon Nano-technology, pp. 122-123, (2003).

* cited by examiner

Primary Examiner—Hoai Pham
(74) Attorney, Agent, or Firm—Finnegan, Henderson, Farabow, Garrett & Dunner, L.L.P.

(57) ABSTRACT

A semiconductor device comprises an island shaped channel layer formed on a substrate, the channel later being composed of a semiconductor material, a gate insulation film formed on the channel layer, a gate electrode formed on the gate insulation film, an insulation film formed on both side faces opposite to one direction of the channel layer, a source electrode and a drain electrode made of a metal material and formed on a side face of the insulation layer.

11 Claims, 7 Drawing Sheets

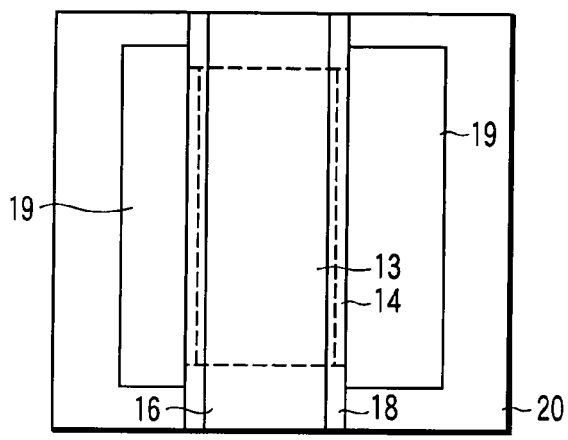
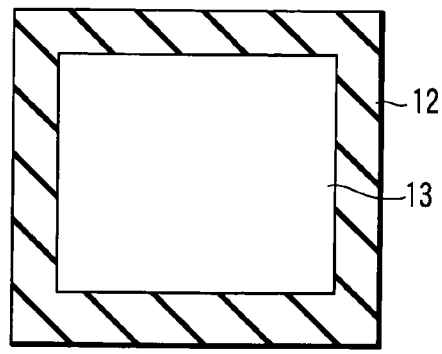
FIG. 1A
FIG. 2A
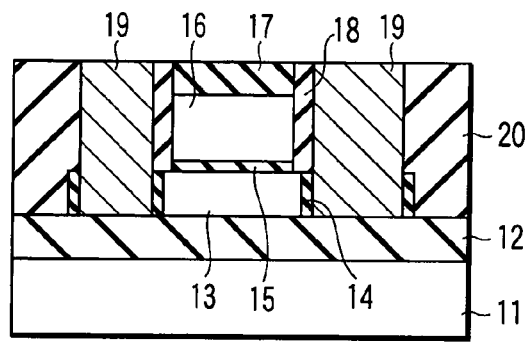
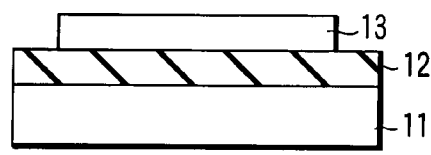
FIG. 1B
FIG. 2B
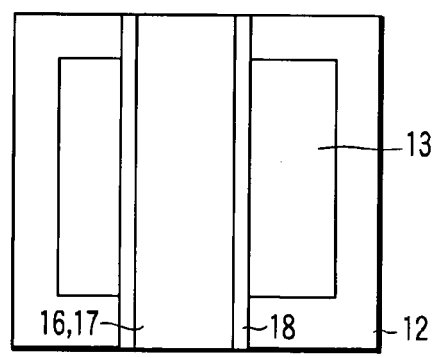
FIG. 3A
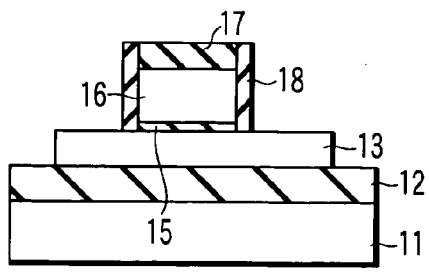
FIG. 3B

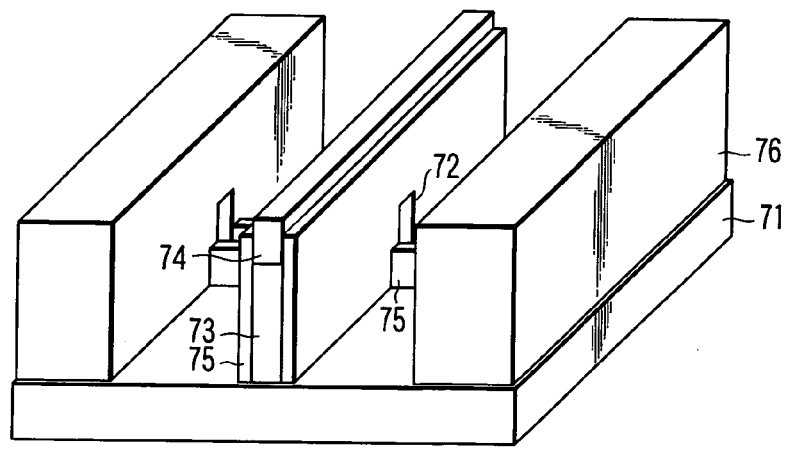
F I G. 14D
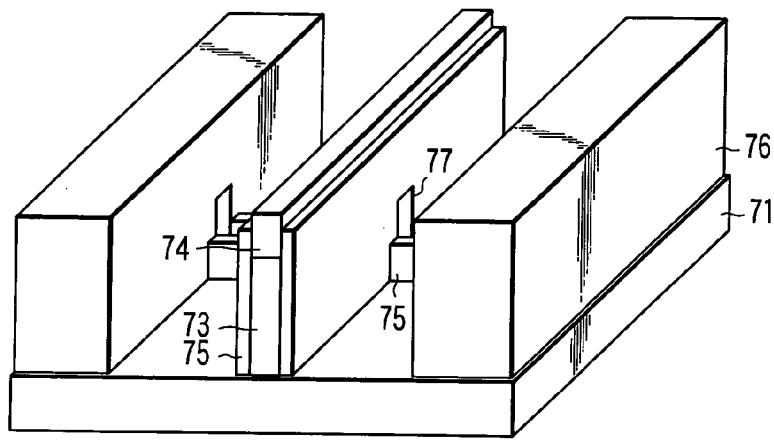
F I G. 14E
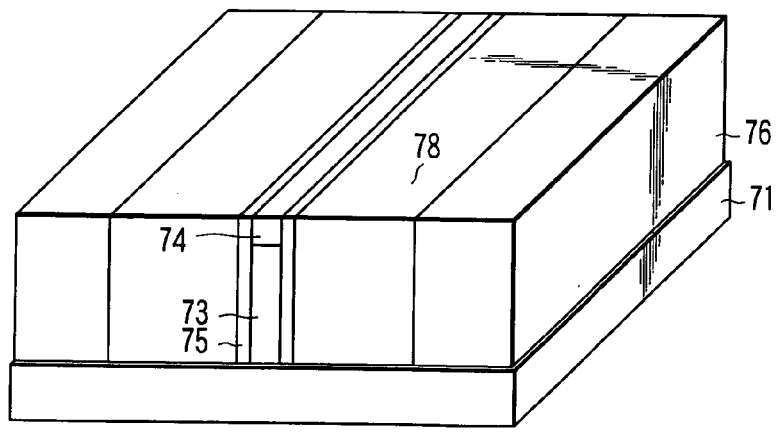
F I G. 14F

SEMICONDUCTOR DEVICE HAVING A SCHOTTKY SOURCE/DRAIN TRANSISTOR

CROSS-REFERENCE TO RELATED APPLICATIONS

This application is based upon and claims the benefit of priority from prior Japanese Patent Applications No. 2004-205849, filed Jul. 13, 2004; and No. 2005-113482, filed Apr. 11, 2005, the entire contents of both of which are incorporated herein by reference.

BACKGROUND OF THE INVENTION

1. Field of the Invention

The present invention relates to a semiconductor device having a Schottky source/drain transistor.

2. Description of the Related Art

A Schottky source/drain transistor technology of producing a transistor's source/drain portion formed of a metal material instead of an impurity diffusion layer is proposed. By using this structure, a parasitic resistance in source and drain regions can be reduced, and a shallow junction (Schottky junction) can be formed.

In addition, because impurities are not used for a source/drain, there is no need for carrying out a high temperature annealing process for activation, and a manufacturing process can be significantly simplified.

Furthermore, a Schottky barrier exists at a source portion, an OFF current is restricted, and a short channel effect can be restricted (the transistor can be minimized).

On the other hand, a problem to be solved with this transistor is to reduce a Schottky contact resistance. One solution to this problem includes a work function control technology for a source/drain material. For example, there is proposed a method of using a metal or silicide (such as $ErSi_2$) with a small work function is used for an nMOS source/drain and using a metal or silicide (such as PtSi) with a large work function for a pMOS source/drain.

By using this technology, a Schottky barrier height at nMOSFET can be set to about 0.28 eV, and a Schottky barrier height at pMOSFET can be set to about 0.22 eV. Therefore, it is possible to form a metal silicide source/drain with a certain low Schottky contact resistance in both of nMOSFET and PMOSFET. However, these values are not insufficient in order to obtain a sufficient high current, and further Schottky barrier reduction is required. Unfortunately, only with a work function control of a metal, it has been difficult to further reduce a Schottky barrier because the barrier is affected by a Fermi level pinning effect.

There is proposed a metal source/drain transistor technology of forming a thin insulation film on a Schottky junction interface in order to reduce the Schottky barrier while avoiding influence caused by the Fermi level pinning effect (Daniel Connelly et al., Silicon Nano-technology, P. 122), (2003).

When a thin insulation film (for example, SiN film of 1 nm or less) is formed on the interface of the Schottky junction which is sandwiched between a Si-channel and a metal source/drain, a low Schottky barrier can be realized while restraining the Fermi level pinning effect. However, a conventional silicide process cannot be used to form this transistor. Therefore, it has been impossible to easily form a small transistor having a gate length of a nano-level. Dimensions of a transistor reported by Connelly are very large (about 20 μm in gate length), and a semiconductor substrate is used as a gate. Thus, a gate electrode edge and a source/drain have not been self-aligned.

BRIEF SUMMARY OF THE INVENTION

According to an aspect of the present invention, there is provided a semiconductor device comprising: an island shaped channel layer formed on a substrate, the channel layer being composed of a semiconductor material; a gate insulation film formed on the channel layer; a gate electrode formed on the gate insulation film; an insulation film formed on both side faces opposite to one direction of the channel layer; and a pair of source/drain electrode made of a metal material and formed on both side faces of the insulation layer.

According to another aspect of the present invention, there is provided a semiconductor device comprising: a rectangle shaped channel layer formed on an insulator, the channel layer having two pairs of opposite side faces; a gate insulation film provided on a top face of the channel layer and on one of the pairs of side faces of the channel layer; an insulation film formed on the other of the pairs of side faces of the channel layer; and a pair of source/drain electrode made of a metal material provided on the insulation film.

According to still another aspect of the present invention, there is provided a semiconductor device manufacturing method comprising: forming a channel layer made of an island shaped semiconductor material on a substrate; forming a gate insulation film and a gate electrode on the channel layer; forming an interlayer insulation film which surrounds the periphery of the gate insulation film and gate electrode on the substrate; forming a pair of holes which sandwiches the gate electrode, a part of a side wall of the holes being composed of the channel layer; forming an insulation film on a surface of the channel layer which configures the side wall of the holes; and forming a pair of source/drain electrode by embedding a metal material in the pair of holes.

BRIEF DESCRIPTION OF THE SEVERAL VIEWS OF THE DRAWING

FIGS. 1A and 1B are views each showing a configuration of nMOSFET according to a first embodiment of the present invention;

FIGS. 2A and 2B are views each showing a process for manufacturing a semiconductor apparatus according to the first embodiment of the invention;

FIGS. 3A and 3B are views each showing a process for manufacturing a semiconductor apparatus according to the first embodiment of the invention;

FIGS. 14A to 14F are a birds-eye view illustrating a structure and a manufacturing method of NMOSFFET according to a fifth embodiment of the present invention.

DETAILED DESCRIPTION OF THE INVENTION

Figure 4A:
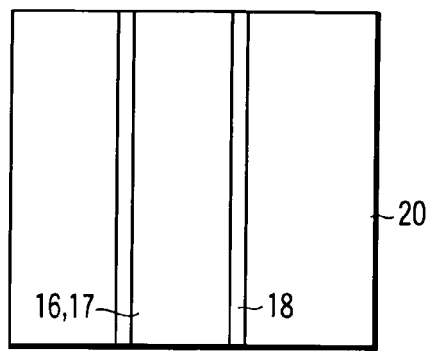
FIGS. 4A and 4B are views each showing a process for manufacturing a semiconductor apparatus according to the first embodiment of the invention.

Hereinafter, embodiments of the present invention will be described with reference to the accompanying drawings.

FIRST EMBODIMENT

FIGS. 1A and 1B are views each showing a configuration of nMOSFET according to a first embodiment of the present invention. FIG. 1A is a plan view, and FIG. 1B is a cross-sectional view taken along a gate length direction.

As shown in FIGS. 1A and 1B, nMOSFET is formed on an n-type silicon substrate or a support substrate 11 and an SOI substrate having a buried oxide film 12 and a silicon layer 13 laminated thereon. An island shaped channel layer 13 is formed on the buried oxide film 12. A silicon oxide film 14 of about 1 nm in film thickness is formed on a side wall of the channel layer 13. A gate insulation film 15 is formed on the channel layer 13. The gate insulation film 15 is composed of a high dielectric film such as $HfO_2$. A gate electrode 16 composed of polysilicon is formed on the gate insulation film 15. A cap film 17 is formed on the gate electrode 16. The cap film 17 is composed of a silicon nitride.

A side wall insulation film 18 is formed on the silicon nitride film 14 and the channel layer 13 and on a side wall of each of the gate insulation film 15, the gate electrode 16, and the cap film 17. A side wall insulation film 18 is composed of a silicon nitride, for example. A pair of source/drain electrode 19 is formed on the buried oxide film 12 and on a side face of each of the silicon nitride film 14 and the side wall insulation film 18. The pair of source/drain electrode 19 is composed of, for example, Erbium, serving as a metal with a low work function. The pair of source/drain electrode 19 has a Schottky contact with respect to the channel layer 13. An interlayer insulation film 20 is formed on the buried oxide film 12 and on a side face of each of the source/drain electrode 19 and the side wall insulation film 18.

Now, a method for manufacturing nMOSFET shown in FIGS. 1A and 1B will be described here. FIGS. 2A to 9A and FIGS. 2B to 9B are views each showing a process for manufacturing a semiconductor device according to the first embodiment of the invention. FIGS. 2A to 9A are plan views and FIGS. 2B to 9B are cross-sectional views in the gate length direction in FIGS. 2A to 9A.

As shown in FIGS. 2A and 2B, an SOI substrate of about 20 nm in film thickness of an SOI layer is provided. The SOI layer is processed in an island shape, and the channel layer 13 is formed. As shown in FIGS. 3A and 3B, the gate insulation film 15, a polysilicon film 16, and the cap layer 17 are laminated on the channel layer 13. The gate insulation film 15, the polysilicon film 16, and the cap film 17 are patterned in the shape of the gate electrode 16. The side wall insulation film 18 of about 10 nm in film thickness is formed on the side face of each of the gate insulation film 15, the gate electrode 16, and the cap electrode 17.

Figure 5A:
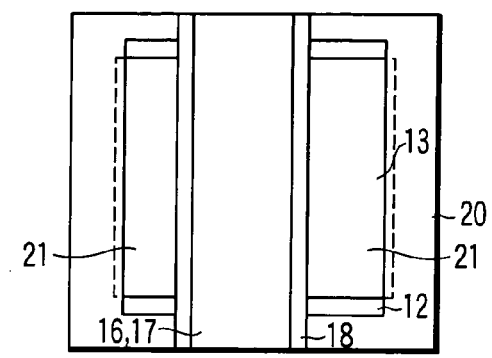
FIGS. 5A and 5B are views each showing a process for manufacturing a semiconductor apparatus according to the first embodiment of the invention.
Figure 4B:
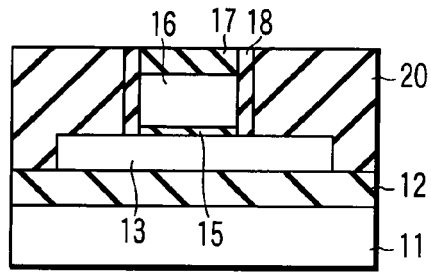
Figure 5B:
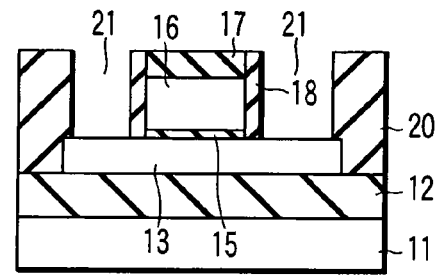
Figure 6A:
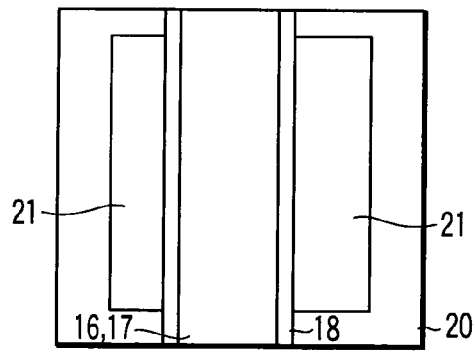
FIGS. 6A and 6B are views showing a process for manufacturing a semiconductor apparatus according to the first embodiment of the invention.
Figure 6B:
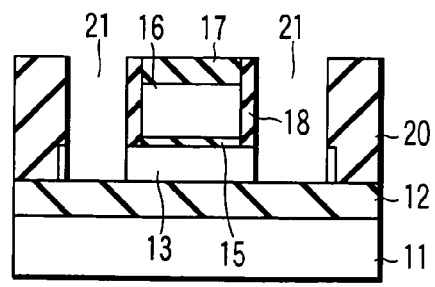

As shown in FIGS. 4A and 4B, after the interlayer insulation film 20 has been fully laminated, a surface of the interlayer insulation film 20 is flattened by the CMP technique. The CMP is carried out until a surface of the cap layer 17 has been exposed. As shown in FIGS. 5A and 5B, the interlayer insulation film 20 in a region in which a pair of source/drain electrode is formed is removed by a lithography technique and an RIE technique, whereby a pair of hole 21 is formed. A resist pattern having an opening which serves as a mask may be formed so as to cross the gate electrode. An etching condition for the interlayer insulation film 20 is optimized, thereby making it possible to selectively etch the interlayer insulation film 20 without engraving the side wall insulation film 18 and the cap film 17. As shown in FIGS. 6A and 6B, after a resist pattern has been removed, the channel layer 13 is selectively etched. The pair of hole 21 is formed in accordance with the above-described process. A part of the side wall of the holes 21 is the side face of the channel layer 13.

Figure 7A:
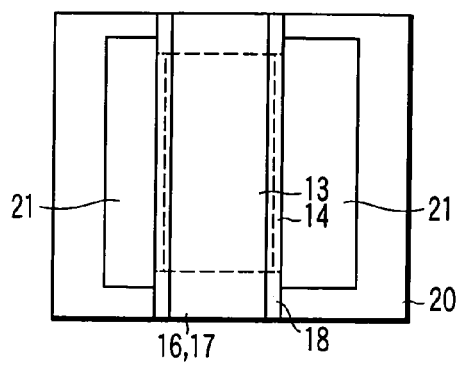
FIGS. 7A and 7B are views showing a process for manufacturing a semiconductor apparatus according to the first embodiment of the invention.
Figure 7B:
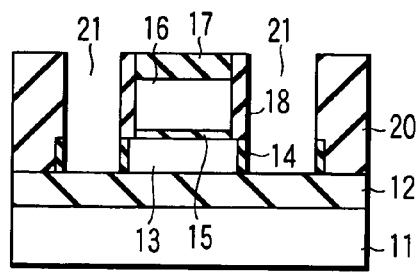

As shown in FIGS. 7A and 7B, the silicon nitride film 14 is formed on the side face of the channel 13 exposed in the pair of hole 21. The film thickness of the silicon nitride film 14 is about 1 nm. The silicon nitride film 14 is formed by carrying out an annealing process at 700° C. in an ammonia atmosphere and making nitride on the surface of the channel layer 13.

Figure 8A:
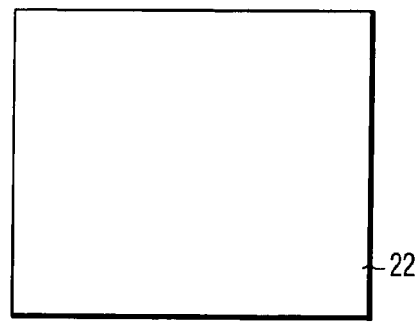
FIGS. 8A and 8B are views showing a process for manufacturing a semiconductor apparatus according to the first embodiment of the invention.
Figure 8B:
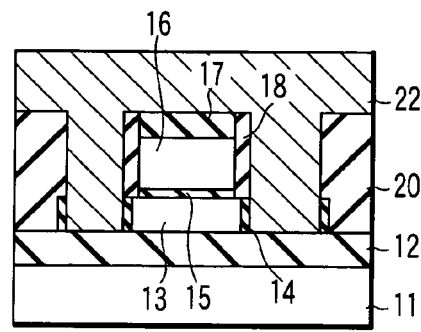
Figure 9A:
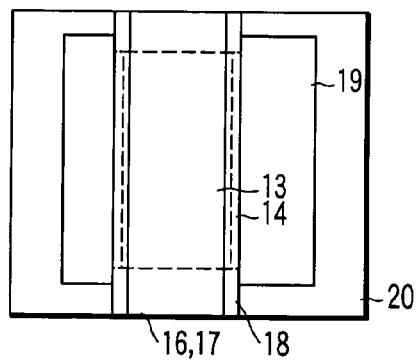
FIGS. 9A and 9B are views showing a process for manufacturing a semiconductor apparatus according to the first embodiment of the invention.
Figure 9B:
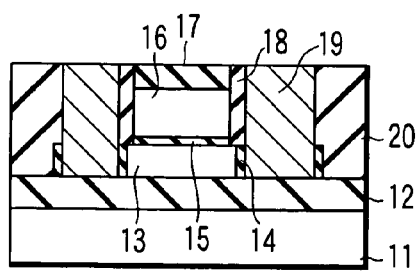

As shown in FIGS. 8A and 8B, Erbium (Er) 22 is laminated by about 300 nm fully on the support substrate 11. Erbium (Er) is provided as an example of metal with a low work function. As shown in FIGS. 9A and 9B, in order to form the pair of source/drain electrode 19, the Erbium 22 is etched back and flattened by nitric acid etching, aqua regia (a mixture of hydrogen peroxide water and nitrate), or the CMP technique.

The subsequent process is similar to a general LSI manufacturing process. That is, an interlayer insulation film or the like is laminated in accordance with the CVD technique. Upper layer metal wires (for example, Al wire) connected to the pair of source/drain electrode 19 and the gate electrode are formed in accordance with a dual Damascene technique.

Although the silicon nitride film 14 of about 1 nm in film thickness is formed on the side face of the channel layer 13, a silicon nitride film of a thickness of single atom layer (one mono-layer) or more (about 0.15 nm in silicon nitride layer) and 1 nm or less in film thickness is formed, whereby a pinning effect can be restricted. In addition, without being limited to a silicon nitride film, even with a silicon oxide film and a silicon oxynitride film, advantageous effect of restricting a pinning effect can be obtained.

As described above, the following advantageous effect can be obtained according to the configuration of the present embodiment.

A Schottky source/drain transistor with a low contact resistance, the transistor restricting the Fermi level pinning effect, can be formed in accordance with an easy manufacturing process. A source and a drain are formed of a metal material, and thus, a process is simplified because ion implantation and high temperature annealing process for forming an impurity diffusion layer source/drain does not exist. Further, a high-k gate insulation film is hardly crystallized. Thus, miniaturization of the above transistor can be carried out. That is, the gate electrode 16 and the pair of source/drain electrode 19 can be formed in a self-aligned manner.

Figure 10:
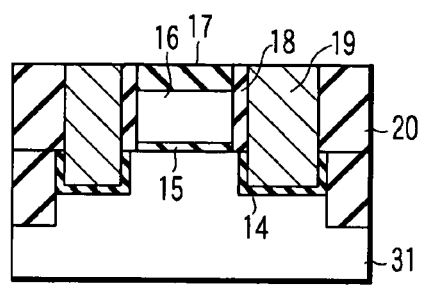
FIG. 10 is a view showing a configuration of a modified example of the nMOSFET according to the first embodiment.

In the first embodiment, although nMOSFET is formed on the SOI substrate, it is possible to form nMOSFET on a silicon single crystal substrate 31, as shown in FIG. 10. Moreover, pMOSFET can be formed by changing a material for the pair of source/drain electrode.

SECOND EMBODIMENT

The second embodiment describes a method for manufacturing CMOSFET obtained by combining nMOSFET and pMOSFET.

FIGS. 11A to 11D are sectional views each showing a process for manufacturing a semiconductor device according to a second embodiment of the present invention.

Figure 11A:
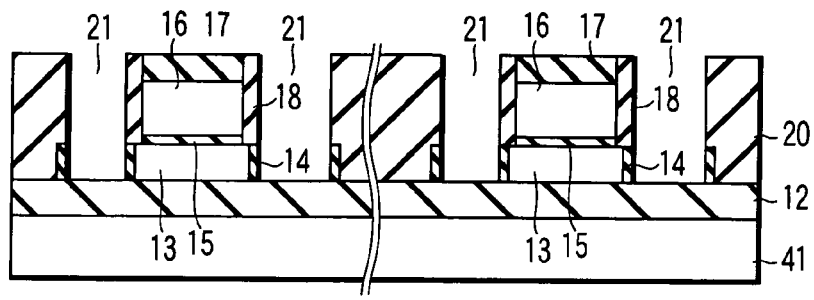
FIGS. 11A to 11D are sectional views each showing a process for manufacturing a semiconductor apparatus according to a second embodiment of the present invention.

A structure shown in FIG. 11A is formed through a process similar to the processes described with reference to FIGS. 2A to 7A and FIGS. 2B to 7B in the first embodiment. The left side of the device indicates an nMOSFET region, and the right side thereof indicates a pMOSFET region. Reference numeral 41 denotes a support substrate made of p-type silicon.

Figure 11B:
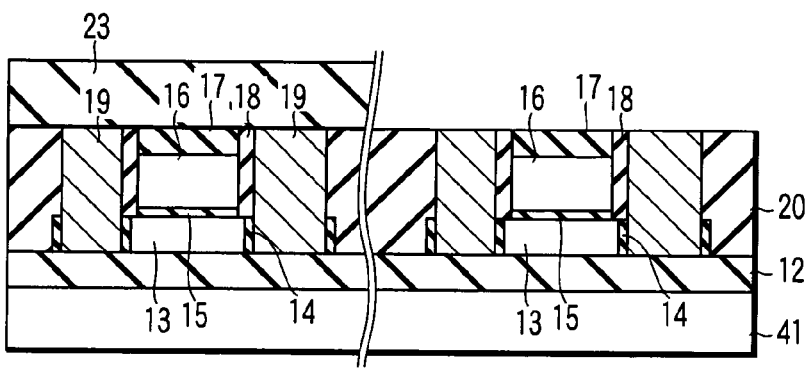
Figure 11C:
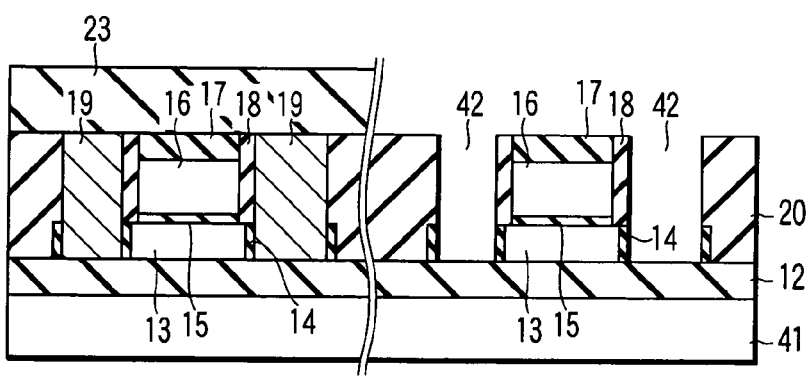

As shown in FIG. 11B, Erbium 19 is embedded and formed in the holes 21. Next, as shown in FIG. 11C, a thin insulation film 23 is formed on a surface of the nMOSFET region. The Erbium 19 in the pMOSFET region is selectively removed, whereby the pair of source/drain electrode 19 is formed in the nMOSFET region. The Erbium 19 in the PMOSFET region is removed by nitric acid etching or a mixture of hydrogen peroxide water and sulfuric acid. Reference numeral 42 denotes a pair of hole.

Figure 11D:
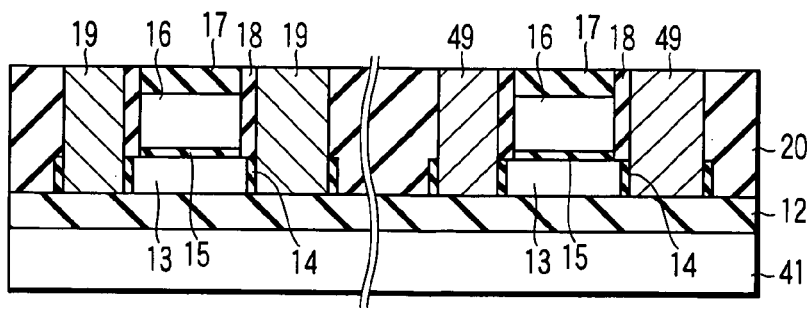

As shown in FIG. 11D, after the thin insulation film 23 has been removed, a pair of source/drain electrode 49 is embedded and formed in the holes 42 of the pMOSFET region. The pair of source/drain electrode 49 is formed by etching back and/or flattening Pt using a mixture of hydrochloric acid and nitric acid or CMP after a metal with a high work function (for example, platinum (Pt)) has been fully laminated in thickness of about 300 nm.

The subsequent process is similar to a general LSI manufacturing process. That is, an interlayer insulation film or the like is laminated in accordance with the CVD technique. Upper layer metal wires (for example, Al wire) connected to the source/drain electrodes 19, 49 and gate electrode are formed in accordance with the Dual Damascene technique.

As described above, CMOSFET using a material suitable to the pair of source/drain electrode of each of nMOSFET and pMOSFET can be easily formed.

THIRD EMBODIMENT

FIGS. 12A to 12D are section views each showing a process for manufacturing a semiconductor device according to a third embodiment of the present invention.

Figure 12A:
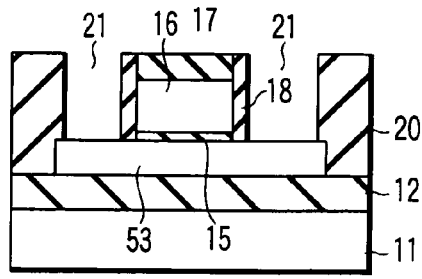
FIGS. 12A to 12D are sectional views each showing a process for manufacturing a semiconductor apparatus according to a third embodiment of the present invention.

As shown in FIG. 12A, the process described with reference to FIGS. 2A to 5A and FIGS. 2B to 5B in the first embodiment is applied to an SOI layer 53 whose surface orientation is (111).

Figure 12B:
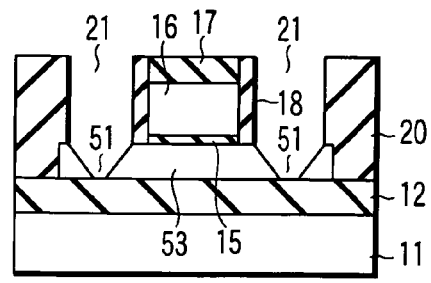

As shown in FIG. 12B, the SOI layer 53 is etched by using a KOH solution. When the SOI layer is etched by using the KOH solution, a pair of hole 51 whose side face is formed in a normal tapered shape is formed.

Figure 12C:
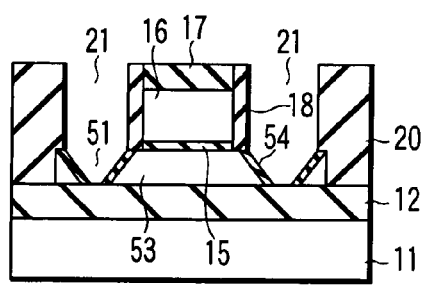
Figure 12D:
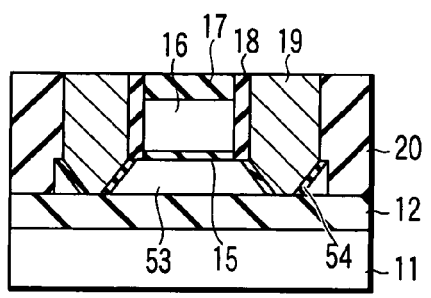

As shown in FIG. 12C, a side face of a channel layer 53 exposed in the pair of hole 51 is annealed and made nitride in an ammonia atmosphere and at about 700° C., and a SiN layer 54 of 1 nm or less in film thickness is formed. As shown in FIG. 12D, Erbium is embedded and formed in the holes 21 and 51, and the pair of source/drain electrode 19 is formed.

The subsequent process is similar to a general LSI manufacturing process. That is, an interlayer insulation film or the like is laminated in accordance with the CVD technique. Upper layer metal wires (for example, Al wire) connected to the pair of source/drain electrode 19 and gate electrode are formed in accordance with the Dual Damascene technique.

In the present embodiment, by forming the SOI side wall in a normal tapered shape, a short channel effect is restricted, thus making it possible to further miniaturize a transistor.

Although the silicon nitride film 54 of about 1 nm is formed on the side face of the channel layer 53, a silicon nitride film of a thickness of single atom layer or more (about 0.15 nm in silicon nitride layer) and 1 nm or less in film thickness is formed, whereby a pinning effect can be restricted. In addition, without being limited to a silicon nitride film, even with a silicon oxide film and a silicon oxynitride film, advantageous effect of restricting a pinning effect can be obtained.

FOURTH EMBODIMENT

FIGS. 13A to 13D are sectional views each showing a process for manufacturing a semiconductor device according to a fourth embodiment of the present invention.

Figure 13A:
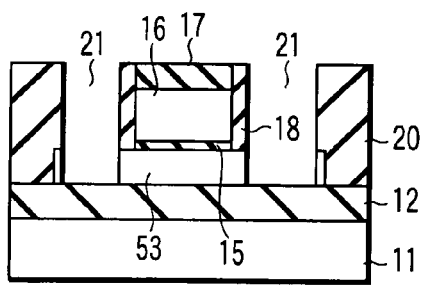
FIGS. 13A to 13D are sectional views each showing a process for manufacturing a semiconductor apparatus according to a fourth embodiment of the present invention.
Figure 13B:
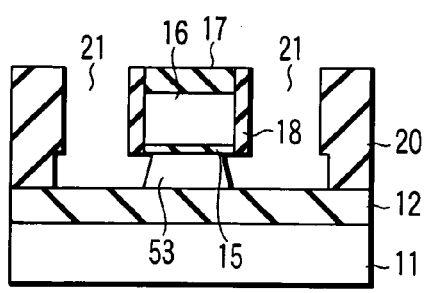
Figure 13C:
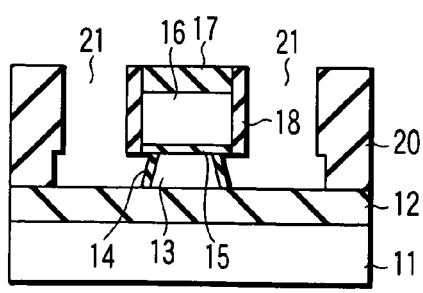
Figure 13D:
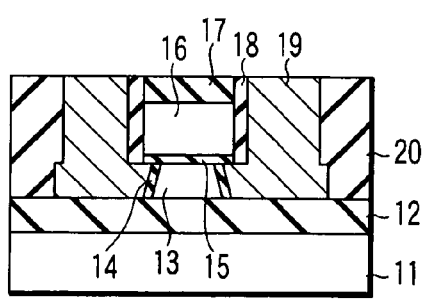

A structure shown in FIG. 13A is formed through a process similar to the process described with reference to FIGS. 2A and 2B to 6A and 6B in the first embodiment. As shown in FIG. 13B, the CDE is carried out for the channel layer 13, and the side face of the channel layer is retracted. As shown in FIG. 13C, the silicon nitride film 14 is formed on the side face of the channel layer 13. As shown in FIG. 13D, the pair of source/drain electrode 19 is embedded and formed in the pair of hole 21. The subsequent process is similar to a general LSI manufacturing process. That is, an interlayer insulation film or the like is laminated in accordance with the CVD technique; contact holes are formed on each of the pair of source/drain electrode and gate electrode; and upper layer metal wires (for example, Al wire) are formed in the Dual Damascene technique (not shown).

Since an overlap amount of the gate electrode and the source/drain electrode can be increased by retracting the side face of the channel layer, this transistor can be further highly driven, and the on-state current of the transistor can be increased.

FIFTH EMBODIMENT

FIGS. 14A to 14F are bird views each illustrating a structure and a manufacturing method of NMOSFET according to a fifth embodiment of the present invention. The fifth embodiment describes that this proposal can be applied to a three-dimensionally structured transistor (Fin-FET) as well.

Figure 14A:

First, as shown in FIG. 14A, an SOI substrate of about 100 nm in film thickness is provided. Si-Fin 72 having height of about 100 nm and thickness of about 10 nm in a transverse direction is formed on the buried oxide film 71 in accordance with the lithography and etching technique.

Figure 14B:
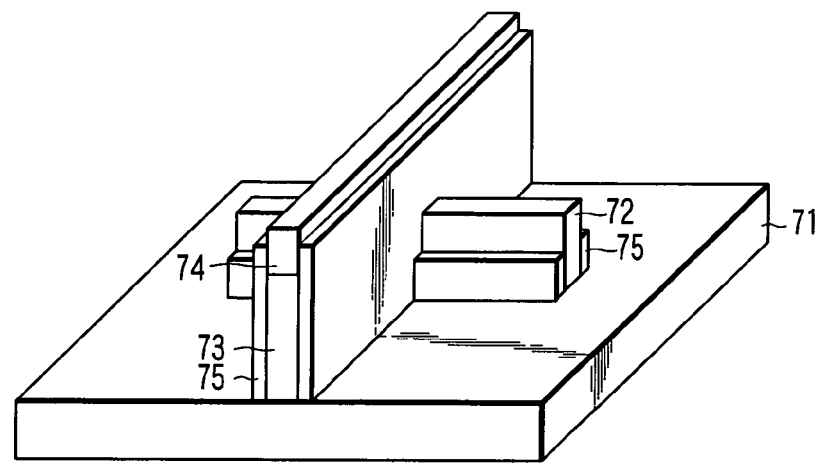

As shown in FIG. 14B, after forming the gate insulation film (for example, high-k film such as $HfO_2$), a polysilicon film of about 150 nm in film thickness and a silicon nitride film are laminated. A silicon nitride film and a polysilicon film are patterned, and a gate electrode 73 having a gate length of 20 nm and a cap layer 74 are formed. The gate electrode 73 is formed so that a longitudinal direction of the gate electrode 73 and a longitudinal direction of the Si-Fin 72 cross each other.

A side wall insulation film 75 of about 7 nm in film thickness is formed on a side face of each of the gate electrode 73 and the cap layer 74. The side wall insulation film 75 is formed by carrying out anisotropic etching after the silicon nitride film has been fully laminated. The side wall insulation film 75 is slightly formed on a side face of the Si-Fin 72 as well.

Figure 14C:
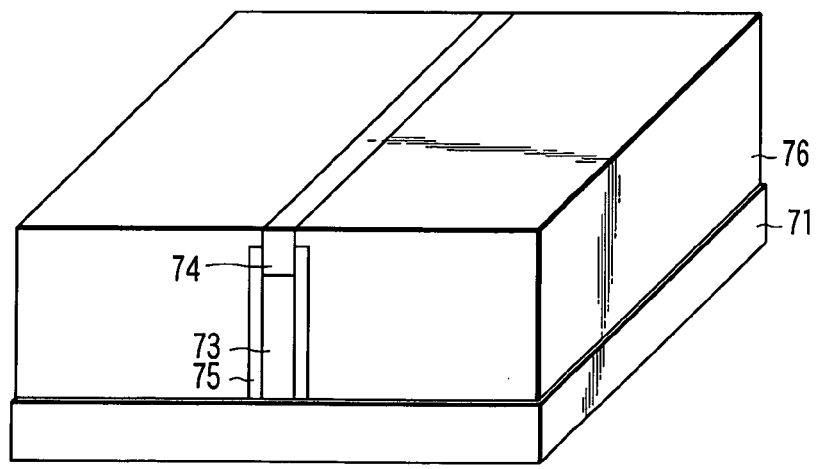

As shown in FIG. 14C, an interlayer insulation film 76 is entirely laminated. A surface of the interlayer insulation film 76 is flattened by using the CMP technique. The CMP is carried out until the cap layer (SiN film) 74 has been exposed. As shown in FIG. 14D, the interlayer insulation film 76 is selectively removed, and grooves are formed. The Si-Fin 72 in the grooves is removed in accordance with the RIE. The inside of the grooves is a region in which a source/drain electrode is to be formed.

As shown in FIG. 14E, a silicon nitride film 77 of about 1 nm in film thickness is formed on the surface of the Si-Fin 72 exposed in the grooves. The silicon nitride film is formed by annealing it in an ammonia atmosphere and at about 700° C.

As shown in FIG. 14F, Erbium is embedded and formed in the grooves, thereby forming a pair of source/drain electrode 78.

The subsequent process is similar to a general LSI manufacturing process. That is, an interlayer insulation film or the like is laminated in accordance with the CVD technique. Upper layer metal wires (for example, Al wire) connected to the pair of source/drain electrode 78 and the gate electrode are formed in accordance with the Dual Damascene technique.

Although the silicon nitride film 77 of about 1 nm in film thickness is formed on the side face of the Si-Fin 72, a silicon nitride film of a thickness of single atom layer or more (about 0.15 nm in silicon nitride layer) and 1 nm or less in film thickness is formed, whereby a pinning effect can be restricted. In addition, without being limited to a silicon nitride film, even with a silicon oxide film and a silicon oxynitride film, advantageous effect of restricting a pinning effect can be obtained.

As described above, the following advantageous effect can be attained according to the configuration of the fifth embodiment.

A Schottky source/drain-FinFET having a low contact resistance, the element restricting the Fermi level pinning effect can be formed in accordance with an easy manufacturing process. A source and a drain are formed of a metal material, and thus, ion implantation or high temperature annealing process for forming an impurity diffusion layer source/drain does not exist. Therefore, a process is simplified, and a high-k gate insulation film is hardly crystallized.

It is possible to miniaturize the above transistor. That is, the gate electrode and the source/drain can be formed in a self-aligned manner.

Since there is no need for ion implantation on a side face of Si-Fin, the pair of source/drain electrode is easily formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    an island shaped channel layer formed on a substrate, the channel layer being composed of a semiconductor material;
    a gate insulation film formed on the channel layer;
    a gate electrode formed on the gate insulation film;
    an insulation film formed on both side faces opposite to one direction of the channel layer; and
    a pair of source/drain electrode made of a metal material and formed on both side faces of the insulation layer.

2. A semiconductor device according to claim 1, further comprising a side wall insulation film formed on the both side faces opposite to one direction of the gate electrode,
    wherein the pair of source/drain electrode is formed over side faces of the side wall insulation film.

3. A semiconductor device according to claim 1, further comprising an interlayer insulation film formed on a side face of each of the pair of source/drain electrode,
    wherein a top face of the interlayer insulation film and a top face of each of the pair of source/drain electrode are present on a substantially same plane.

4. A semiconductor device according to claim 1, wherein the channel layer is composed of silicon.

5. A semiconductor device according to claim 4, wherein a surface orientation of the channel layer is (111), and both side faces opposite to one direction of the channel layer are formed in a normal tapered shape.

6. A semiconductor device according to claim 1, wherein the insulation film is a silicon nitride film of 1 nm or less in film thickness.

7. A semiconductor device according to claim 1, wherein the both side faces opposite to one direction of the channel layer are formed more inside of a position of the both side faces opposite to one direction of the gate electrode.

8. A semiconductor device according to claim 1, a sectional dimension of the channel layer parallel to a main face of the substrate is small from the substrate to the gate electrode.

9. A semiconductor device according to claim 1, wherein the pair of source/drain electrode is composed of any one of Erbium and Platinum.

10. A semiconductor device comprising:
    a rectangle shaped channel layer formed on an insulator, the channel layer having two pairs of opposite side faces;
    a gate insulation film provided on a top face of the channel layer and on one of said pairs of side faces of the channel layer;
    an insulation film formed on the other of said pairs of side faces of the channel layer; and
    a pair of source/drain electrode made of a metal material provided on the insulation film.

11. A semiconductor device according to claim 10, wherein each of the pair of source/drain electrode is composed of any one of Erbium and Platinum.

* * * * *